US009548221B2

(12) United States Patent
Holsteyns et al.

(10) Patent No.: US 9,548,221 B2
(45) Date of Patent: Jan. 17, 2017

(54) METHOD AND APPARATUS FOR PROCESSING WAFER-SHAPED ARTICLES

(71) Applicant: LAM RESEARCH AG, Villach (AT)

(72) Inventors: Frank Holsteyns, Kortenberg (AT); Alexander Lippert, Villach (AT)

(73) Assignee: LAM RESEARCH AG, Villach (AT)

( * ) Notice: Subject to any disclaimer, the term of this patent is extended or adjusted under 35 U.S.C. 154(b) by 134 days.

(21) Appl. No.: 14/198,121

(22) Filed: Mar. 5, 2014

(65) Prior Publication Data
US 2014/0182636 A1    Jul. 3, 2014

Related U.S. Application Data

(62) Division of application No. 13/718,901, filed on Dec. 18, 2012, now Pat. No. 8,691,022.

(51) Int. Cl.
*H01L 21/67* (2006.01)
(52) U.S. Cl.
CPC ... *H01L 21/67023* (2013.01); *H01L 21/67051* (2013.01)
(58) Field of Classification Search
CPC ............... H01L 21/67051; H01L 21/67023
See application file for complete search history.

(56) References Cited

U.S. PATENT DOCUMENTS

| 3,790,079 | A | 2/1974 | Berglund et al. |
| 3,842,226 | A | 10/1974 | Yoon |
| 4,019,683 | A * | 4/1977 | Asai ............ B05B 17/0623 239/102.2 |
| 4,629,478 | A | 12/1986 | Browner et al. |
| 4,958,052 | A | 9/1990 | Mahieu |
| 5,601,235 | A | 2/1997 | Booker et al. |
| 5,882,433 | A | 3/1999 | Ueno |
| 7,963,466 | B2 | 6/2011 | Van Rijn et al. |
| 8,236,251 | B2 | 8/2012 | Toda et al. |
| 2001/0054431 | A1 * | 12/2001 | Masui .................. B08B 3/08 134/3 |
| 2004/0261817 | A1 * | 12/2004 | Araki ............. H01L 21/67051 134/2 |

(Continued)

FOREIGN PATENT DOCUMENTS

DE  25 43 635    4/1976
DE  39 12 524    11/1989

(Continued)

OTHER PUBLICATIONS

Strutt, J.W., Lord Rayleigh. "On the Instability of Jets." Proceedings of the London Mathematical Society 10 (1878): 4-13.

(Continued)

*Primary Examiner* — Michael Barr
*Assistant Examiner* — Benjamin L Osterhout

(57) ABSTRACT

The wet treatment of wafer-shaped articles is improved by utilizing a droplet generator designed to produce a spray of monodisperse droplets. The droplet generator is mounted above a spin chuck, and is moved across a major surface of the wafer-shaped article in a linear or arcuate path. The droplet generator includes a transducer acoustically coupled to its body such that sonic energy reaches a region of the body surrounding the discharge orifices. Each orifice has a width w of at least 1 μm and at most 200 μm and a height h such that a ratio of h to w is not greater than 1.

8 Claims, 5 Drawing Sheets

(56) References Cited

U.S. PATENT DOCUMENTS

| | | | |
|---|---|---|---|
| 2006/0118132 A1* | 6/2006 | Bergman | B08B 3/02 134/1 |
| 2007/0154636 A1* | 7/2007 | Hashizume | B05B 7/066 427/240 |
| 2007/0169800 A1* | 7/2007 | Fani | B08B 3/12 134/56 R |
| 2007/0235062 A1* | 10/2007 | Fujiwara | C03C 23/0075 134/4 |
| 2008/0011330 A1* | 1/2008 | Kruwinus | H01L 21/67034 134/31 |
| 2008/0017219 A1 | 1/2008 | Franklin | |
| 2008/0041420 A1* | 2/2008 | Sekiguchi | B08B 3/02 134/18 |
| 2008/0060686 A1* | 3/2008 | Miya | B08B 7/0014 134/37 |
| 2008/0127508 A1* | 6/2008 | Ohno | H01L 21/02052 34/552 |
| 2008/0178911 A1* | 7/2008 | Hahn | H01L 21/67051 134/33 |
| 2009/0056746 A1* | 3/2009 | Sandhu | B08B 3/02 134/3 |
| 2009/0065026 A1* | 3/2009 | Kiehlbauch | H01J 37/3233 134/1.2 |
| 2009/0114246 A1* | 5/2009 | Sinha | B08B 3/10 134/1.3 |
| 2011/0031326 A1 | 2/2011 | Sato | |
| 2012/0012105 A1 | 1/2012 | Heskamp et al. | |

FOREIGN PATENT DOCUMENTS

| | | |
|---|---|---|
| DE | 100 13 450 | 9/2001 |
| DE | 100 13 451 | 10/2001 |

OTHER PUBLICATIONS

Berglund, R.N., Liue B.Y.H. "Generation of Mondisperse Aerosol Standards" Particle Technology Laboratory, Environmental Science & Technology, vol. 7, No. 2, Feb. 1973.

Sauret A. and Shum H.C. "Forced generation of simple and double emulsions in all-aqueous systems", American institute of Physics, Applied Physics Letters 100, 154106 (2012).

* cited by examiner

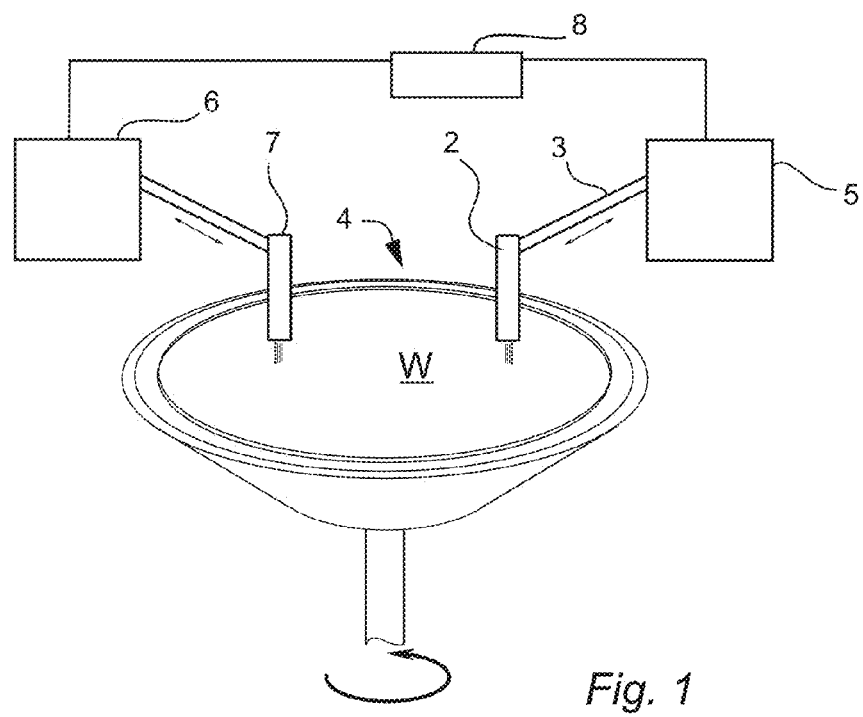
Fig. 1
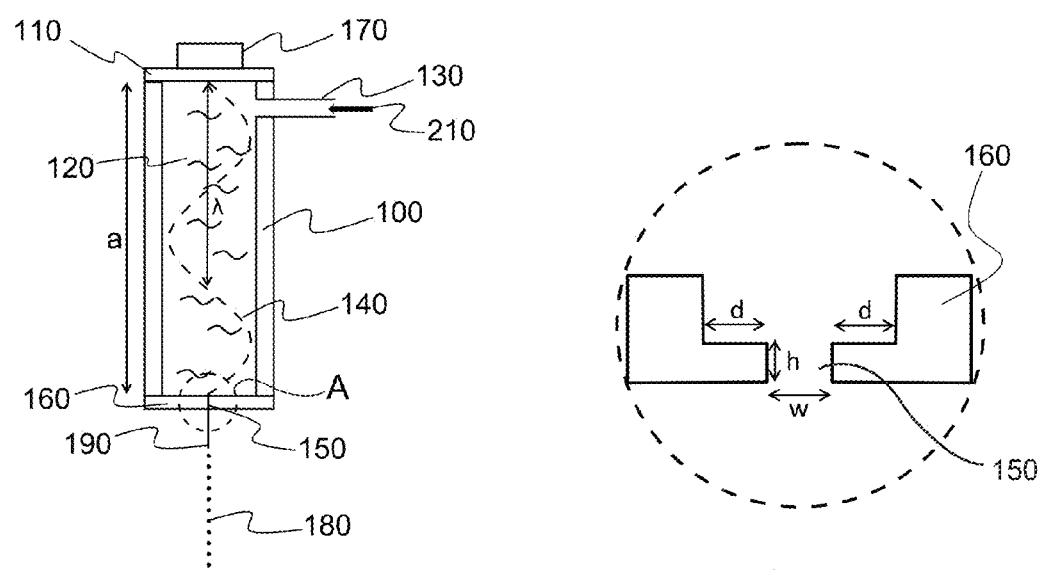
Fig. 2
Fig. 3

METHOD AND APPARATUS FOR PROCESSING WAFER-SHAPED ARTICLES

BACKGROUND OF THE INVENTION

The present invention relates to a method and apparatus for processing wafer-shaped articles, such as semiconductor wafers.

During the manufacture of semiconductor wafers the surfaces of the wafers go through various processes, including removal of chemical residues or particulate matter. Currently, mixing nozzles are used for the cleaning process in single-wafer wet processing modules. In these nozzles, a cleaning solution is mixed with pressurized gas to form a spray. As the device features formed on semiconductor wafers continue to decrease in size, various problems resulting from the use of conventional wet processes arise, including damage to the microstructures on the surface of the substrate, presence of patterns on the substrate as a result of non-uniform cleaning, long process times, and a lack of control. Thus it would be desirable to have an apparatus for the treatment of wafer-shaped articles that addresses these problems.

SUMMARY OF THE INVENTION

The present inventors have discovered that the problems described above in connection with conventional wet processing equipment are due at least in part to the droplets of the conventional liquid sprays being polydisperse, i.e., having droplets of significantly varying diameters. On the basis of that discovery, the present inventors have developed new devices and methods for mitigating some of the aforementioned problems, through the use of a monodisperse spray.

Thus, in one aspect, the invention relates to an apparatus for wet treatment of wafer-shaped articles, comprising a spin chuck adapted to hold a wafer-shaped article in a predetermined orientation, and a droplet generator having a body, an inlet for liquid, at least one orifice for discharging liquid onto a surface of a wafer-shaped article when positioned on the spin chuck, and at least one transducer acoustically coupled to the body such that sonic energy reaches a region of the body surrounding the at least one orifice. The droplet generator is configured to dispense liquid through the at least one orifice as a spray of monodisperse liquid droplets. A process liquid dispenser is positioned relative to the spin chuck and the droplet generator so as to dispense a process liquid onto a same side of a wafer-shaped article as liquid discharged from the droplet generator. A controller is configured to control a spray of monodisperse liquid droplets from the droplet generator in relation to process liquid dispensed from the process liquid dispenser.

In preferred embodiments of the apparatus according to the present invention, an arm is connected to the droplet generator and is configured to move the droplet generator in a linear or arcuate path that is generally parallel to a wafer-shaped article when mounted on the spin chuck.

In preferred embodiments of the apparatus according to the present invention, the at least one orifice has a width w of at least 1 µm and at most 200 µm and a height h such that a ratio of h to w is not greater than 1.

In preferred embodiments of the apparatus according to the present invention, the droplet generator further comprises a liquid reservoir and a pressure vessel for holding compressed gas, and wherein the liquid reservoir, pressure vessel, and the droplet generator are interconnectable.

In preferred embodiments of the apparatus according to the present invention, the droplet generator further comprises a high-pressure pump and a liquid reservoir, and wherein the high-pressure pump is connectable to the liquid reservoir, and the droplet generator.

In preferred embodiments of the apparatus according to the present invention, the droplet generator comprises at least one linear array of at least two orifices.

In preferred embodiments of the apparatus according to the present invention, the at least one orifice is contained in a plate attached to the body.

In preferred embodiments of the apparatus according to the present invention, the high pressure pump is configured to pressurize liquid to a pressure P within the range of 2 to 50 bar.

In preferred embodiments of the apparatus according to the present invention, the width w is from 10 µm to 80 µm.

In another aspect, the present invention relates to a method for processing wafer-shaped articles, comprising dispensing a process liquid onto a major surface of a wafer-shaped article from a process liquid dispenser, so as to form a film of process liquid on the major surface of the wafer shaped article, and separately discharging another liquid from a droplet generator through at least one orifice formed in the droplet generator while applying sonic energy to the liquid as it passes through the at least one orifice, wherein the sonic energy has a wavelength $\lambda$ such that a wave number ka is from 0.3 to 1, wherein $ka = w\pi/\lambda$, thereby to generate a stream of monodisperse droplets of the liquid, and causing the stream of monodisperse droplets to impact upon the film of process liquid.

In preferred embodiments of the method according to the present invention, the droplet generator is moved parallel to the major surface of a wafer-shaped article.

In preferred embodiments of the method according to the present invention, the wafer-shaped article is rotated about an axis that is generally perpendicular to the major surface, and the process liquid is dispensed such that the film of process liquid impacted by the stream of monodisperse droplets has a thickness of not greater than 0.5 mm.

In preferred embodiments of the method according to the present invention, the liquid of the monodisperse droplets has a viscosity less than or equal to that of water.

In preferred embodiments of the method according to the present invention, the sonic energy is generated by a piezoelectric transducer.

In preferred embodiments of the method according to the present invention, the liquid is discharged through multiple orifices each having an essentially same size of 10 µm to 80 µm.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 1 is a schematic perspective view of an apparatus for wet wafer treatment, according to an embodiment of the present invention;

FIG. 2 is a cross-sectional view of the droplet generator 2 of FIG. 1;

FIG. 3 is an enlarged view of the detail A of FIG. 2, which better shows the orifice 150;

DETAILED DESCRIPTION

Figure 4:
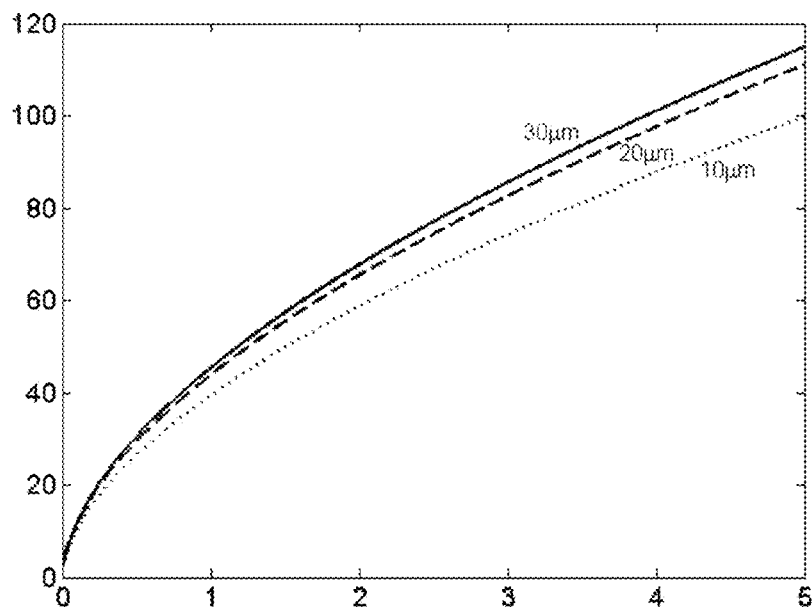
FIG. 4 shows the relation between the liquid pressure and the droplet speed for different orifice diameters, in an embodiment of the method according to the invention.

In FIG. 1, an apparatus for wet processing of single semiconductor wafers comprises a spin chuck (4) for supporting and rotating a wafer W, a droplet generator (2), and a support arm (3) on which the droplet generator (2) is mounted. The arm (3) is mounted on a support frame (5) so that it can move the droplet generator (2) over the spin chuck (4) (and consequently a substrate W), for example along a linear path that is approximately perpendicular to the axis of rotation of the spin chuck (4), or along an arcuate path in a plane that is approximately perpendicular to the axis of rotation of the spin chuck (4). In practice, this movement of the arm (3) and generator (2) is normally effected as the substrate W rotates.

Another liquid dispenser (6) is preferably also included, which dispenses a process liquid through a nozzle (7), which may be of a conventional configuration. Droplet generator (2) and nozzle (7) dispense their respective process liquids at different locations onto the upwardly-facing surface of wafer W under control of a computer microcontroller (8), as will be described in greater detail below. In the illustrated embodiment, the droplet generator (2) and nozzle (7) are each movable above the surface of wafer W independently of one another, although in other embodiments these components could be either fixed or fixed relatively to one another, i.e., conjointly movable.

In FIG. 2, the droplet generator (2) of this embodiment includes a body (100) that is supplied with a pressurized process liquid (210) through an inlet (130). The body (100) includes a bottom plate (160) and a top plate (110). The bottom plate (160) contains at least one orifice (150) through which a laminar liquid jet (190) is formed. The top plate (110) is equipped with a transducer (170) (for example a piezoelectric transducer glued to the plate (110) with an epoxy resin). This transducer (170) can be electrically driven at a chosen frequency f and power to apply sonic energy (140) with wavelength λ to the process liquid (120) present in the container (100). Consequently, there will be sonic energy (140) in the process liquid (120) within the orifice (150). This sonic energy (140) will provoke a Rayleigh-Plateau instability in the jet (190), which will in turn lead to the disintegration of the jet (190) into monodisperse droplets (180).

FIG. 3 illustrates the width w and depth h of the orifice (150). The width w should be from 1 μm to 200 μm, preferably from 2 μm to 100 μm, and more preferably from 10 μm and 80 μm, with exemplary values being 10 μm, 20 μm and 30 μm. The ratio of h to w should be not greater than 1, and preferably between 0.05 and 0.5. The preferred values for w and h:w yield a range of values for h that would result in a relatively thin outlet plate, so it is useful to configure the orifice (150) within an indentation of width d in a thicker plate (160).

The flow rate of the jet (190) can be tuned by varying the pressure of the liquid (210). The diameter D of the droplets (180) is a function of the width w of the orifice, the pressure P applied to the process liquid (210), the drive frequency f, and the physical properties the liquid (210). However, for low viscosity liquids (e.g., viscosities less than or equal to that of water), D is principally a function of the orifice diameter w, and is approximately 1.891 w, although the droplet diameter D can be slightly varied by changing the frequency f.

Equations have been developed that define the frequency range for which the formation of monodisperse droplets from all jets is ensured, and the volume flow (and thus jet velocity) of a liquid through a sharp-edged hole in a thin plate, based on the pressure P of the driving flow. The frequency is given by the following equation:

$$f = C1\left(\frac{ka}{\pi w}\right)\left(\frac{4}{\pi}\right)\left(\frac{\mu}{\rho w}\right)\left(\frac{P\rho w^2}{\mu^2}\right)^{C2} \qquad \text{Equation 1}$$

where w is the width of the orifice, ρ is the density of the liquid (210), μ is the viscosity of the liquid (210), P is the pressure, C1 and C2 have been experimentally determined to be 0.3601 and 0.5774 respectively, and ka is the dimensionless wavenumber of the sonic energy. ka should be in the range of 0.3 to 1, and preferably equal to about 0.69, as set forth by Rayleigh (1878)[1].

[1] Strutt, J. W., Lord Rayleigh. "On the Instability of Jets." *Proceedings of the London Mathematical Society* 10 (1878): 4-13.

The wavenumber ka can be approximated as $$ka = \frac{w\pi}{\lambda} = \frac{w\pi f}{u} = \frac{w\pi f w^2 \pi}{4V'} = \frac{w^3 \pi^2 f}{4V'} \qquad \text{Equation 2}$$

where u is the phase speed of the sonic energy (140) and V' is the volume flow of the liquid (210). Thus, the frequencies corresponding to the preferred range for the wavenumber ka may be expressed as:

$$\frac{.12V'}{w^3} \leq f \leq \frac{.41V'}{w^3}. \qquad \text{Equation 3}$$

Figure 5:
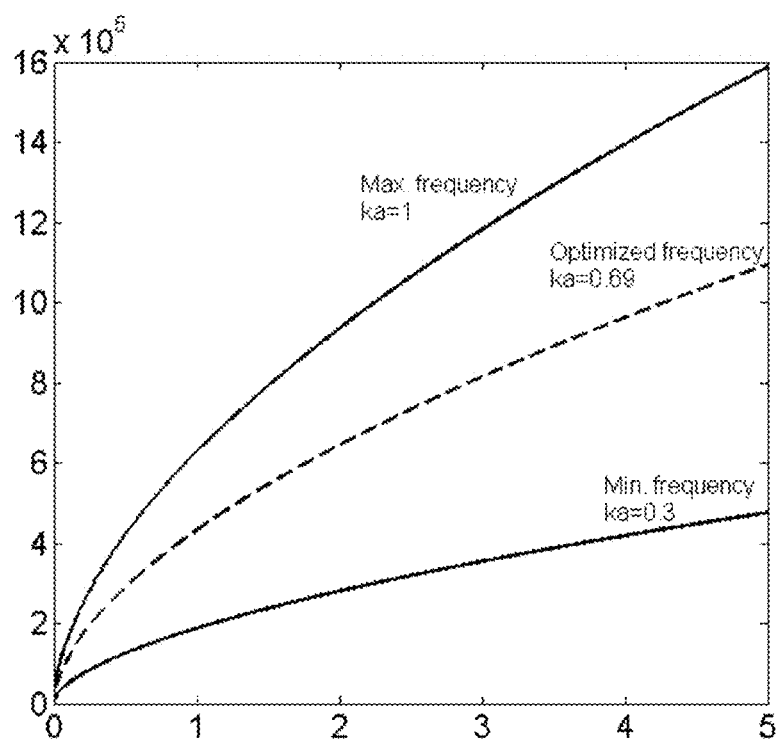
FIG. 5 shows the relation between the liquid pressure and the optimum frequency to generate monodisperse droplets, in an embodiment of the method according to the invention.

FIGS. 4 and 5 graphically depict the relationship of the liquid pressure P to the droplet speed (or jet velocity) and the frequency f, respectively, according to the above equations 1 and 3. Thus, the units of the abscissa in both figures are MPa of applied pressure, whereas the units of the ordinate are the exiting jet speed (and hence the speed at initial droplet formation) in m/s for FIG. 4, and frequency in hundreds of kHz for FIG. 5.

Figure 6:
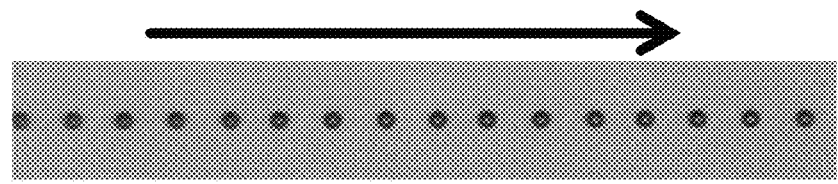
FIG. 6 shows a picture of an array of water droplets produced by an embodiment of the method and apparatus according to the present invention.

FIG. 6 is a photograph of an array of water droplets at room temperature, taken with a high-speed camera. The droplets were generated through a single orifice with a width w of 20 μm, with the excitation frequency f being 188 kHz and the applied pressure P of 3 bar. The droplets have a diameter D of 38 μm and the jet velocity is 20 m/s.

In FIG. 6 it can be seen that the droplet diameters D are remarkably uniform; nevertheless, the term "monodisperse" as used herein does not require absolute identity of droplet diameters, but should instead be understood to encompass a spray of droplets in which the coefficient of variation of the droplet diameters is not greater than 5%, preferably not greater than 3%, and more preferably not greater than 1%, where the coefficient of variation is the ratio of the standard deviation of the droplet diameters to the mean droplet diameter.

Figure 7:
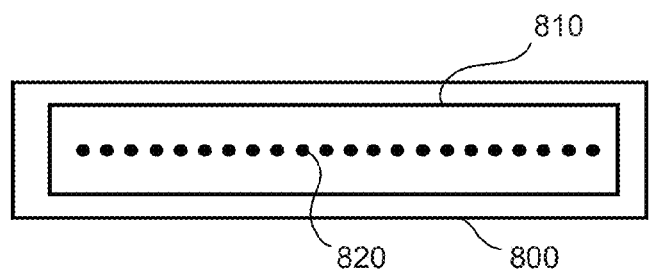
FIG. 7 shows a schematic overview of one embodiment of a plate for use in a droplet generator.
Figure 8:
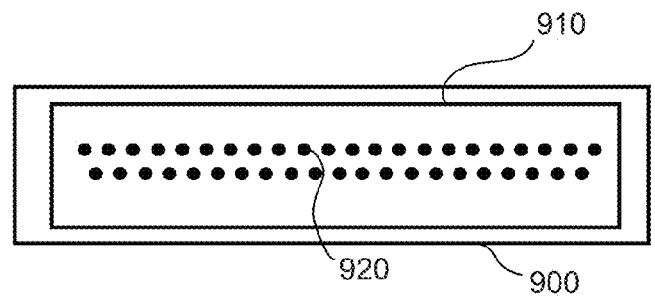
FIG. 8 shows a schematic overview of another embodiment of a plate for use in a droplet generator.
Figure 9:
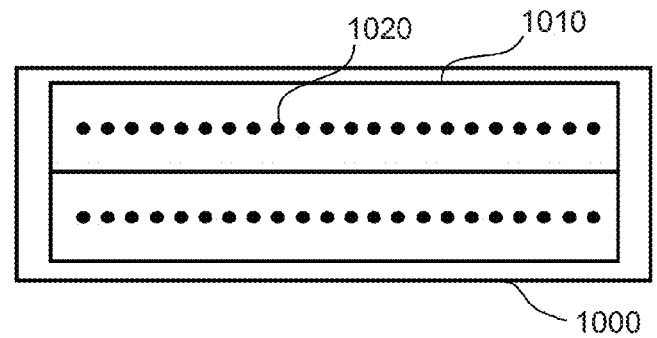
FIG. 9 shows a schematic overview of an embodiment wherein several plates are used in a droplet generator.

For practical purposes, several orifices are preferable to a single orifice (150), and although the number may vary with the particular application, that number is preferably more than ten and more preferably more than twenty. FIG. 7 shows a plate (810) equipped with an array of orifices (820); FIG. 8 shows a plate (910) equipped with multiple arrays of orifices (920); and FIG. 9 shows a plurality of plates (1010) each containing at least one array of orifices (1020). In preferred embodiments, all or part of the bottom plate (160) of FIG. 2 can be replaced with the plates (810), (910), or (1010). These plates (810), (910), and (1010) are made out of silicon, plastic, or stainless steel for example. The plates (160), (810), (910), or (1010) can be removable from the body (100), (800), (900) or (1000). In which case, a plate might be integrated into the body (100) between two parallel plates which are sealed with O-rings (not shown). Of course, more than one plate can be incorporated into the body (100) if desired.

The orifices (820), (920), or (1020) in a given plate (810), (910), or (1010) should all be as nearly as practicable the same size, and the vibrational excitement (140) should work on all emerging liquid jets. Table 1 shows several calculated values, based on equation 3, of the minimum frequency $f_{min}$, optimal frequency $f_{opt}$, and maximum frequency $f_{max}$ for a given orifice width w, volume flow V', and number of orifices.

TABLE 1

| V' (l/h) | V' (mm³/s) | w (mm) | Number of orifices | $f_{min}$ (1/s) | $f_{opt}$ (1/s) | $f_{max}$ (1/s) |
|---|---|---|---|---|---|---|
| .036 | 10 | .02 | 1 | 151,981 | 349,556 | 506,604 |
| .036 | 10 | .02 | 10 | 15,198 | 34,956 | 50,660 |
| .36 | 100 | .02 | 10 | 151,981 | 349,556 | 506,604 |
| .36 | 100 | .02 | 100 | 15,198 | 34,956 | 50,660 |
| 3.6 | 1000 | .02 | 100 | 151,981 | 349,556 | 506,604 |
| .036 | 10 | .04 | 1 | 18,998 | 43,695 | 63,325 |
| .36 | 100 | .04 | 1 | 189,976 | 436,946 | 633,254 |
| .36 | 100 | .04 | 10 | 18,998 | 43,695 | 63,325 |
| 3.6 | 1000 | .04 | 100 | 18,998 | 43,695 | 63,325 |

The orifices are preferably fabricated by dry or wet etching, or alternatively, by laser drilling. The etching process ensures that the several orifices are all essentially the same size. Typically, the droplet generator (2) will be positioned in such a way that an array of orifices is parallel to the radius of the substrate W.

Figure 10:
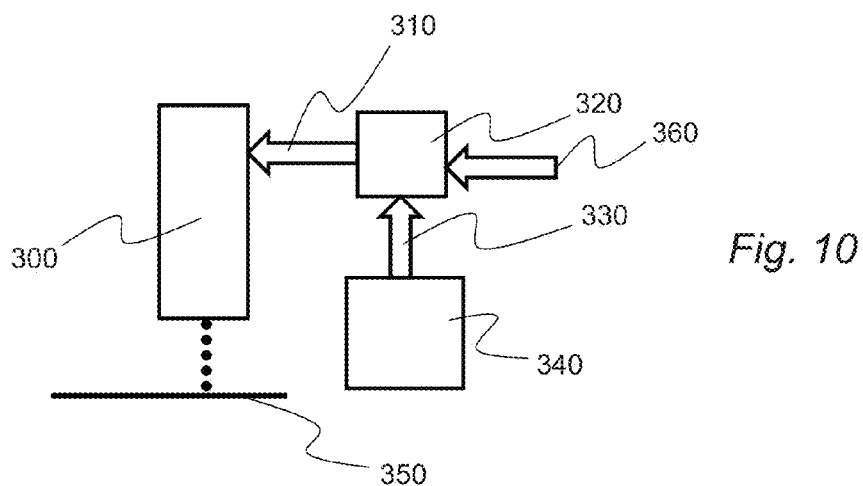
FIG. 10 shows a schematic overview of a preferred embodiment of the apparatus according to the present invention.

In FIG. 10, the liquid is pressurized with compressed gas prior to being introduced into the body (300) of the droplet generator. Compressed gas (e.g. nitrogen, oxygen or air) is kept in a pressure vessel (340). Preferably, the pressure vessel (340) can withstand a pressure up to 50 bar. This compressed gas is connected through a pressure tube (330) to a liquid reservoir (320). The reservoir (320), which is also a pressure vessel, can be filled with a liquid over a liquid supply line (360). The reservoir (320) stores the liquid medium, and a supply line (310) can be opened to provide the pressurized liquid to the body (300) of the droplet generator, which dispenses droplets to a substrate W.

Figure 11:
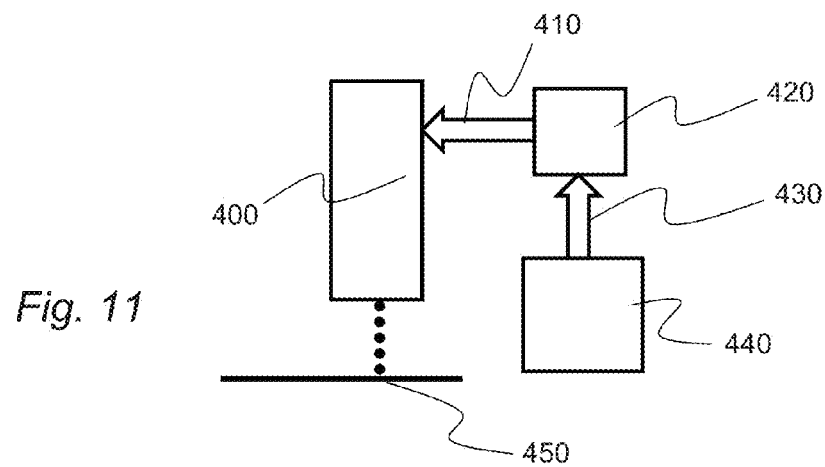
FIG. 11 shows a schematic overview of another preferred embodiment of the apparatus.

In the embodiment of FIG. 11, liquid is pressurized by a high pressure pump (420). The high pressure pump (420) is connected through a tube (430) to a liquid reservoir (440). This high pressure pump (420) can pressurize the liquid to a pressure of preferably from 2 to 50 bar, and can be either a rotating pump or ideally a piston pump. The pump (42) is connected through a high pressure tube (410) to the body of the droplet generator (400), which dispenses droplets to a substrate W.

Figure 12:
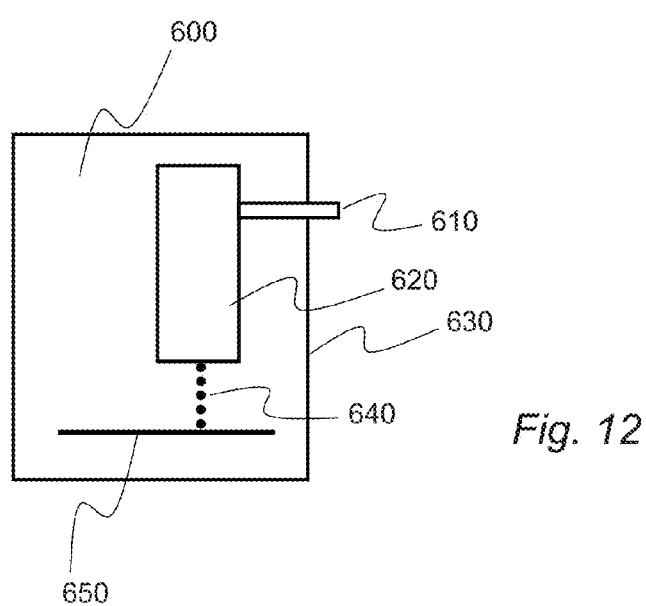
FIG. 12 shows a schematic overview of an embodiment wherein a droplet generator is provided within a pressurized environment.

In the embodiment of FIG. 12, the droplet generator (620) and substrate W are within a pressurized environment (600), which imparts the desired pressure to droplets (640) externally of the droplet generator. The pressurized ambient (600) can be provided for example by a sealed process chamber (630) containing a spin chuck on which wafer W is mounted, together with the droplet generator (620) and its associated inlet (610).

Figure 13:
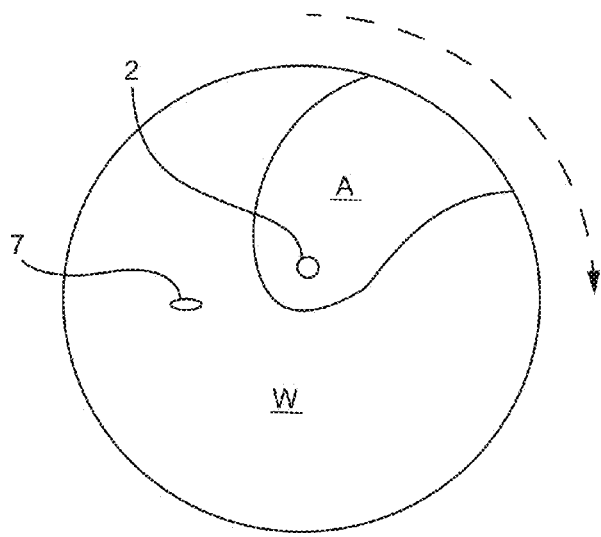
FIG. 13 is a plan view showing a possible spatial relationship between the droplets dispensed by the droplet generator and the separately dispensed process liquid.

As shown in FIG. 13, the process liquid dispenser nozzle 7 is positioned relative to the droplet generator 2 such that the monodisperse droplets are sprayed onto a film of process liquid formed on the wafer surface. For example, the process liquid could be deionized water or SC-1, and the mono-disperse spray is used for providing a droplet impulse into a thin liquid layer. The location of the mono-disperse spray nozzle is controlled in order to spray into an area where the liquid film of process liquid dispensed by nozzle 7 is preferably not more than 0.5 mm thick. The area A in FIG. 13 corresponds to the region where the monodisperse spray is supplied. Therefore a separate movement between cleaning liquid nozzle dispenser and droplet nozzle dispenser is preferred. Alternatively, the wafer may be prewetted with chemistry, e.g. SC1, and thereafter the mono-disperse spray is supplied, thereby resulting in a gradual dilution and removal of the chemistry. Additionally, the chemistry may be dispensed again while the spray is stopped.

Figure 14:
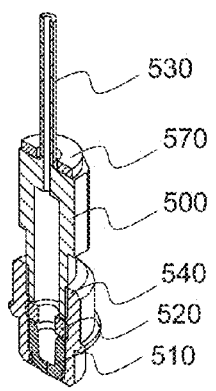
FIG. 14 is a perspective and cross-sectional view of another embodiment of a droplet generator suitable for use in the method and apparatus according to the present invention.

An alternative embodiment of a droplet generator is depicted in FIG. 14, and includes a body 500 that serves as a liquid reservoir, a feed pipe 530 for supplying liquid to the droplet generator, an annular ultrasonic transducer 570, a nozzle tip 510 for generating the spray of monodisperse droplets, a housing 540 for the nozzle tip, which in this embodiment is screwed onto the body 500, and a fixing screw 520 that secures the nozzle 510 within the housing 540.

Figure 15:
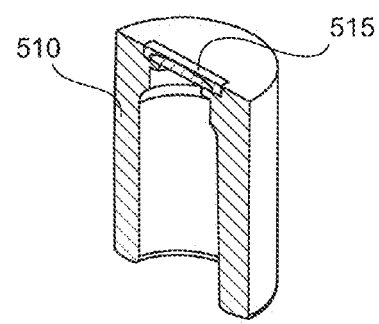
FIG. 15 is a perspective and cross-sectional view of a nozzle insert for a droplet generator.
Figure 16:
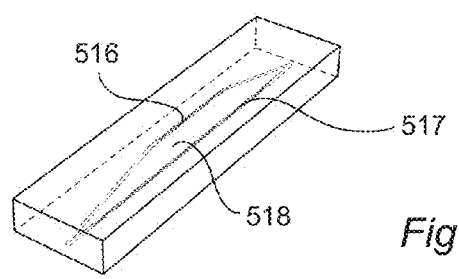
FIG. 16 schematically depicts a 3D view of an atomizing body suitable for use in a droplet generator.

The nozzle tip 510 of this embodiment may be made as described in U.S. Patent Pub. No. 2012/0012105, and present FIGS. 15 and 16 are derived from FIGS. 8 and 3, respectively, of that application. In particular, nozzle tip 510 may include a nozzle chip 515 as described in that application, wherein, with reference to FIG. 16, the liquid to be atomized passes through first and second membranes 516, 517 via a cavity 518 formed therebetween.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. Apparatus for wet treatment of wafer-shaped articles, comprising:
   a spin chuck adapted to hold a wafer-shaped article in a predetermined orientation;
   a droplet generator having a body, an inlet for liquid, at least one orifice for discharging liquid onto a surface of a wafer-shaped article when positioned on the spin chuck, and at least one transducer acoustically coupled to the body such that sonic energy reaches a region of the body surrounding the at least one orifice;
   wherein the at least one orifice has a width w of at least 1 μm and at most 200 μm and a height h such that a ratio of h to w is not greater than 1;
   wherein the droplet generator is configured to dispense liquid through the at least one orifice as a spray of monodisperse liquid droplets;
   a process liquid dispenser positioned relative to the spin chuck and the droplet generator so as to dispense a process liquid onto a same side of a wafer-shaped article as liquid discharged from the droplet generator; and
   a controller configured to control a spray of monodisperse liquid droplets from the droplet generator in relation to process liquid dispensed from the process liquid dispenser.

2. The apparatus according to claim 1, further comprising an arm connected to the droplet generator and configured to move the droplet generator in a linear or arcuate path that is generally parallel to a wafer-shaped article when mounted on the spin chuck.

3. The apparatus according to claim 1, wherein said droplet generator further comprises a liquid reservoir and a pressure vessel for holding compressed gas, and wherein said liquid reservoir, pressure vessel, and said droplet generator are interconnectable.

4. The apparatus according to claim 1, wherein said droplet generator further comprises a high-pressure pump and a liquid reservoir, and wherein said high-pressure pump is connectable to said liquid reservoir, and said droplet generator.

5. The apparatus according to claim 1, wherein said droplet generator comprises at least one linear array of at least two orifices.

6. The apparatus according to claim 1 wherein said at least one orifice is contained in a plate attached to said body.

7. The apparatus according to claim 4, wherein said high pressure pump is configured to pressurize liquid to a pressure P within the range of 2 to 50 bar.

8. The apparatus according to claim 1, wherein said width w is from 10 μm to 80 μm.

* * * * *